(12) United States Patent
Liao et al.

(10) Patent No.: US 11,538,797 B1
(45) Date of Patent: Dec. 27, 2022

(54) ARRAY SUBSTRATE OF EASILY-PLACED LIGHT-EMITTING ELEMENTS, METHOD OF FABRICATING SAME, AND DISPLAY PANEL USING SAME

(71) Applicant: HON HAI PRECISION INDUSTRY CO., LTD., New Taipei (TW)

(72) Inventors: Chin-Yueh Liao, New Taipei (TW); Hui-Chu Lin, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/512,898

(22) Filed: Oct. 28, 2021

(30) Foreign Application Priority Data

Aug. 24, 2021 (CN) .......................... 202110975343.X

(51) Int. Cl.
| | | |
|---|---|---|
| H01L 25/075 | (2006.01) | |
| G02F 1/13357 | (2006.01) | |
| H01L 33/62 | (2010.01) | |
| G02F 1/1335 | (2006.01) | |

(52) U.S. Cl.
CPC .... *H01L 25/0753* (2013.01); *G02F 1/133603* (2013.01); *G02F 1/133612* (2021.01); *H01L 33/62* (2013.01); *H01L 2933/0066* (2013.01)

(58) Field of Classification Search
CPC ................ H01L 25/0753; H01L 33/62; H01L 2933/0066; G02F 1/133603; G02F 1/133612
See application file for complete search history.

(56) References Cited

U.S. PATENT DOCUMENTS

2022/0173156 A1* 6/2022 Park .................... H01L 25/0753

FOREIGN PATENT DOCUMENTS

| CN | 108257976 B | 9/2020 |
|---|---|---|
| TW | 200952210 A | 12/2009 |
| TW | 202005124 A | 1/2020 |

\* cited by examiner

*Primary Examiner* — Anne M Hines
*Assistant Examiner* — Jose M Diaz
(74) *Attorney, Agent, or Firm* — ScienBiziP, P.C.

(57) ABSTRACT

A light-emitting array substrate allowing a higher efficiency in the seating of numerous very small light source elements includes a substrate, an insulating layer on the substrate including positioning holes, and light-emitting elements. Each positioning hole penetrates the insulating layer and forms a first opening and a second opening. For each positioning hole, a size of the bottommost first opening is less than a size of the topmost second opening, and, from topmost to bottommost of the substrate, a projection of the second opening on the substrate more than covers a projection of the first opening on the substrate. A method of fabricating the substrate and a display panel using the substrate are further disclosed.

20 Claims, 10 Drawing Sheets

US 11,538,797 B1

ARRAY SUBSTRATE OF EASILY-PLACED LIGHT-EMITTING ELEMENTS, METHOD OF FABRICATING SAME, AND DISPLAY PANEL USING SAME

FIELD

The subject matter herein generally relates to displays, specifically to a light-emitting array substrate, a method of fabricating the light-emitting array substrate, and a display panel using the light-emitting array substrate.

BACKGROUND

Light-emitting elements such as light-emitting diodes (LEDs) are being made smaller and smaller, as a result, transferring a large number of such elements to a receiving substrate is problematic.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
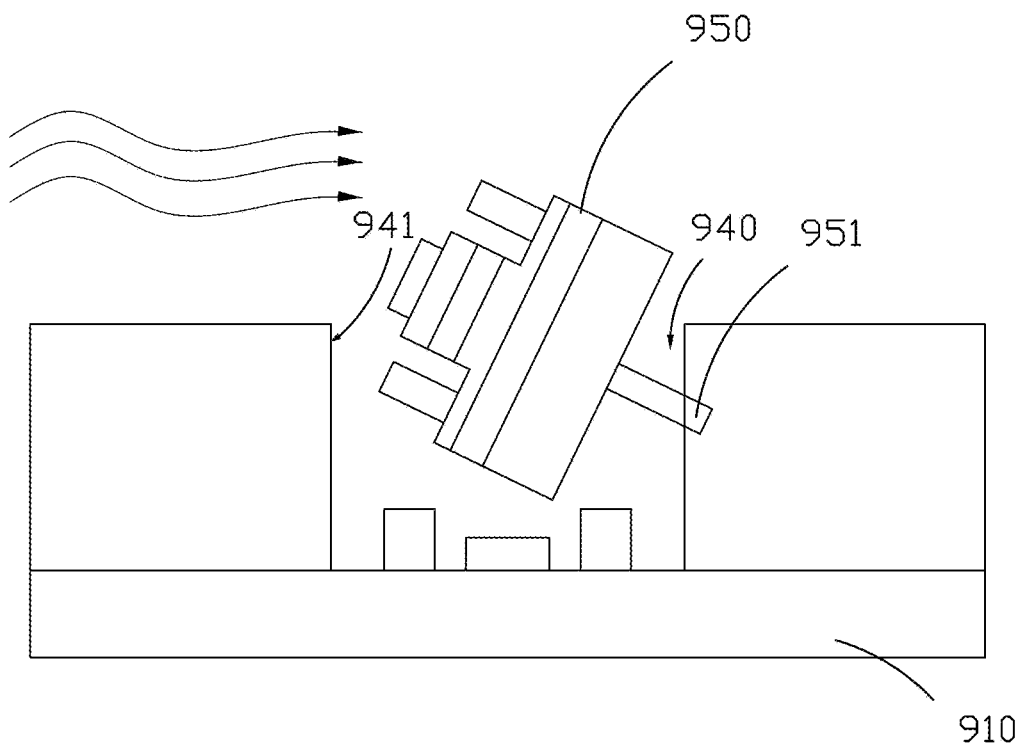
FIG. 1 is a schematic diagram showing the assembly of light-emitting diodes on a substrate in a fluid self-assembly process in the related art.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

Currently, display panels using micro LEDs or mini LEDs as light emitting elements generally use a mass transfer technology due to the small size (less than 200 μm) of the light emitting element. Self-assembly technology using a fluid medium as a branch of mass transfer technology has high efficiency and low cost. During a fluid self-assembly process, liquid is used as a carrier to transfer the LED chips to reserved positions on a substrate of the display panel, and a navigation post is arranged on each of the LED chips to accurately align the LED chips with the reserved positions.

FIG. 1 shows the assembly of LED chips on the substrate in the fluid self-assembly process in the related art. In FIG. 1, the reserved position on a substrate 910 corresponding to an LED chip 950 is a positioning hole 940. A hole wall 941 of the positioning hole 940 is perpendicular to the substrate 910. Therefore, during the fluid self-assembly process, the navigation post 951 of the LED chip 950 ought to be trapped into the hole wall 941 under the action of the fluid. However, since the positioning hole 940 is deep, the LED chip 950 does not easily drop out from the fluid medium, affecting the efficient assembly of the LED chips.

Figure 2:
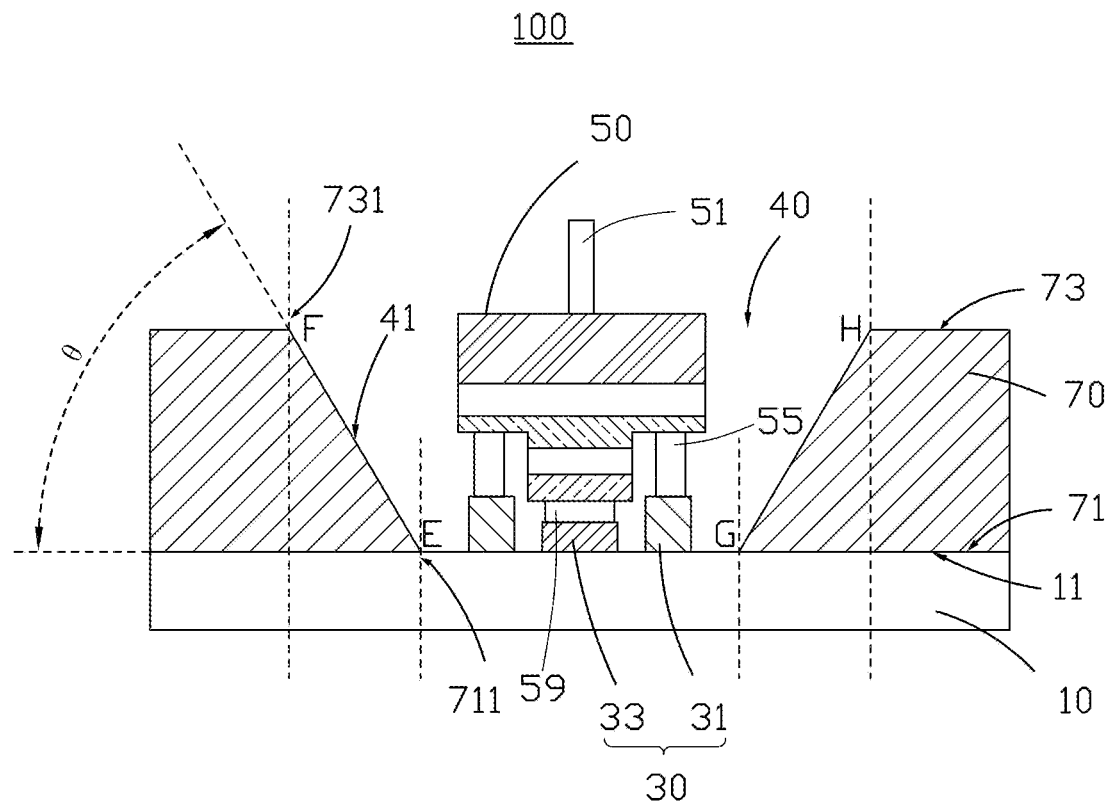
FIG. 2 is a cross-sectional view of a light-emitting array substrate according to an embodiment of the present disclosure.

FIG. 2 shows a light-emitting array substrate according to an embodiment of the present disclosure. The light-emitting array substrate 100 includes a substrate 10 having a surface 11, a plurality of conductive structures 30 (only one is shown) on the surface 11, a plurality of light-emitting diodes (LEDs) 50 (only one is shown), and an insulating layer 70 on the surface 11.

The insulating layer 70 includes a plurality of positioning holes 40 (only one is shown). The conductive structures 30 are insulated and spaced apart from each other. At least a part of each conductive structure 30 is exposed to one of the positioning holes 40 and is able to electrically connect to one LED 50.

Each conductive structure 30 includes a first conductive portion 31 and a separate second conductive portion 33. Each LED 50 is to be located in one positioning hole 40 and electrically connected to one conductive structure 30.

Each LED 50 includes a first electrode 55, a second electrode 59, and a navigation post 51. The first electrode 55 and the second electrode 59 are spaced apart from each other. The navigation post 51 is opposite to the first electrode 55 and the second electrode 59, and is the portion of the LED 50 which is furthest away from the substrate 10.

The substrate 10 includes driving circuit (e.g., thin film transistors) electrically connected to the conductive structures 30 for applying a first voltage (i.e., cathode voltage) to the first conductive portions 31 and a second voltage different from the first voltage (i.e., anode voltage) to the second conductive portions 33. The first electrode 55 is electrically connected to the first conductive portion 31, and the second electrode 59 is electrically connected to the second conductive portion 33. The first conductive portion 31 is configured to receive the first voltage from the substrate 10 and apply the first voltage to the first electrode 55, and the second conductive portion 33 is configured to receive the second voltage from the substrate 10 and apply the second voltage to the second electrode 59. When there is a forward bias between the first electrode 55 and the second electrode 59 of the LED 50, the LED 50 emits light.

In one embodiment, the LED 50 may be a mini LED or a micro LED. "Micro LED" means an LED with a grain size of fewer than 100 microns. The mini LED is also a sub-millimeter LED, its size is between conventional LED and micro LED. "Mini LED" generally means LED with a grain size of about 100 microns to 200 microns.

As shown in FIG. 2, the insulating layer 70 includes a first surface 71 and a second surface 73 opposed to the first surface 71. The first surface 71 is closer to the substrate 10 than the second surface 73 is. Each positioning hole 40 penetrates the first surface 71 and the second surface 73. Each positioning hole 40 includes a first opening 711 formed in the first surface 71 and a second opening 731 formed in the second surface 73. For each positioning hole 40, a size of the first opening 711 is less than a size of the second opening 731. Along a thickness direction of the substrate 10, a projection of the second opening 731 on the substrate 10 completely covers a projection of the first opening 711 on the substrate 10.

In one embodiment, both the first opening 711 and the second opening 731 are circular, and the diameter of the first opening 711 is greater than the diameter of the second opening 731.

In another embodiment, both the first opening 711 and the second opening 731 are rectangular, at least one of the length and the width of the first opening 711 is greater than the length and the width of the second opening 731. In other embodiments, the first opening 711 and the second opening 731 may have irregular but always tapering shapes.

As shown in FIG. 2, the substrate 10 underlies the first opening 711 of the positioning hole 40. That is, the top surface of the substrate 10 forms a bottom wall of the positioning hole 40. Each positioning hole 40 includes a hole wall 41 connecting the first surface 71 and the second surface 73.

In a cross section of the insulating layer 70 along the thickness direction of the substrate 10, on one side of the LED 50, a line segment EF is formed by connecting an intersection point E between the hole wall 41 and the first surface 71 and an intersection point F between the hole wall 41 and the second surface 73. On the other side of the LED 50, a line segment GH is formed by connecting an intersection point G between the hole wall 41 and the first surface 71 and an intersection point H between the hole wall 41 and the second surface 73. An included angle θ between the line segment EF and the substrate 70 is in a range of 30 degrees to 60 degrees. An included angle between the line segment GH and the substrate 70 is equal to the included angle θ and is in a range of 30 degrees to 60 degrees. In other embodiments, the included angle between the line segment GH and the substrate 70 is not equal to the included angle θ and is in a range of 30 degrees to 60 degrees.

In one embodiment, the first opening 711 and the second opening 731 have the same shape, and the projections of the geometric centers of the first opening 711 and the second opening 731 on the surface 11 are coincident. In other embodiments, the shape of the first opening 711 may be different from the shape of the second opening 731. For example, the first opening 711 is square, and the second opening 731 is circular or irregular. The projections of the geometric centers of the first opening 711 and the second opening 731 on the surface 11 may not coincide.

As shown in FIG. 2, a distance between the hole wall 41 and the substrate 10 is gradually and continuously decreased along a direction from the second opening 731 toward the first opening 711. That is, the hole wall 41 on each side is inclined away from the LED 50. In the cross section perpendicular to the direction of the substrate 10, the hole wall 41 appears as the line segment EF and the line segment GH, and the positioning hole 40 appears as a trapezoid, enclosed by points E, F, and H. The slopes of both the line segment EF and the line segment GH are fixed, not variable. That is, the distance between the hole wall 41 and the LED 50 is uniformly decreased along the direction from the second opening 731 toward the first opening 711.

In other embodiments, the distance between the hole wall 41 and the substrate 10 may be non-uniformly decreased along the direction from the second opening 731 toward the first opening 711. That is, in the cross section perpendicular to the direction of the substrate 10, the line segment EF or the line segment GH may be an irregular smooth curve. The distance from the hole wall 41 to the substrate 10 can be entirely reduced along the direction from the second opening 731 toward the first opening 711. That is, there is a region where the distance from the hole wall 41 to the substrate 10 gradually increases in the direction from the second opening 731 toward the first opening 711.

Figure 3:
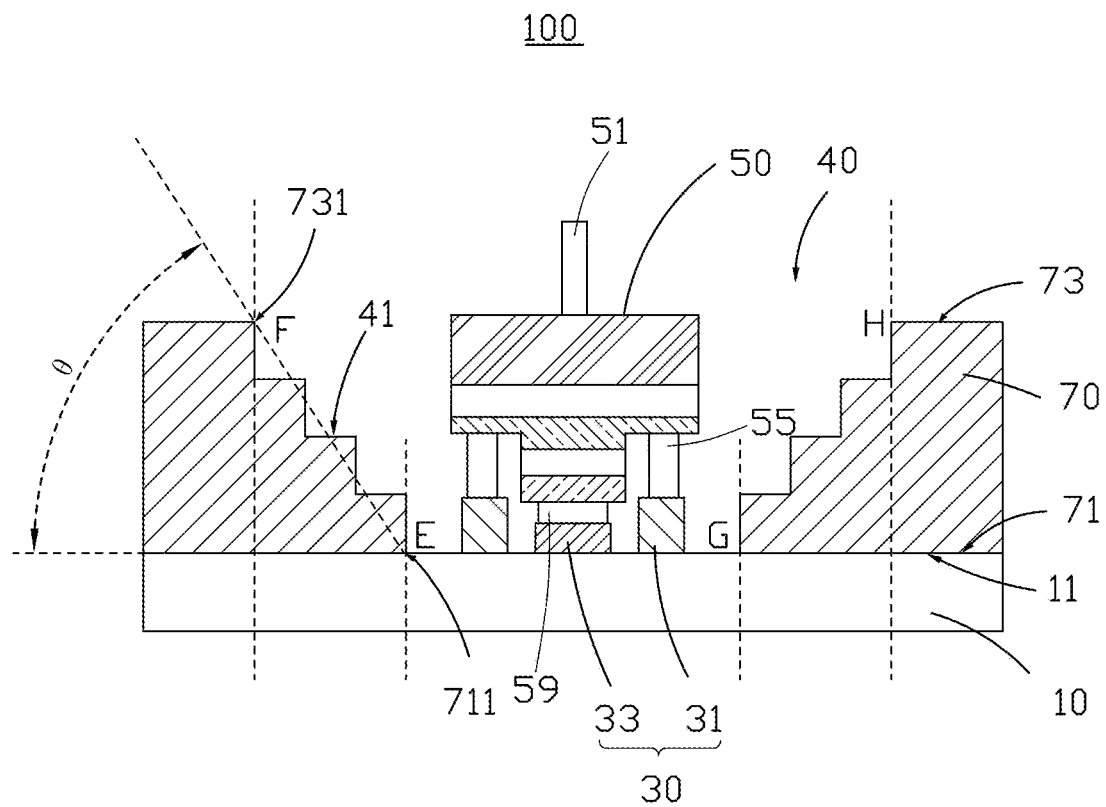
FIG. 3 is a cross-sectional view of the light-emitting array substrate according to another embodiment of the present disclosure.

In another embodiment, the positioning hole 40 is a stepped hole. As shown in FIG. 3, the positioning hole 40 includes four steps, each of which has the same size. In other embodiments, the positioning hole 40 is a stepped hole including at least two steps of different sizes.

As shown in FIG. 3, the line segment EF is formed by connecting the intersection point E between the hole wall 41 and the first surface 71 and the intersection point F between the hole wall 41 and the second surface 73. The line segment GH is formed by connecting the intersection point G between the hole wall 41 and the first surface 71 and an intersection point H between the hole wall 41 and the second surface 73. The included angle θ between the line segment EF and the substrate 70 is in a range of 30 degrees to 60 degrees. The included angle between the line segment GH and the substrate 70 is equal to the included angle θ and is in a range of 30 degrees to 60 degrees. In other embodiments, the included angle between the line segment GH and the substrate 70 is not equal to the included angle θ and is in a range of 30 degrees to 60 degrees.

Figure 4:
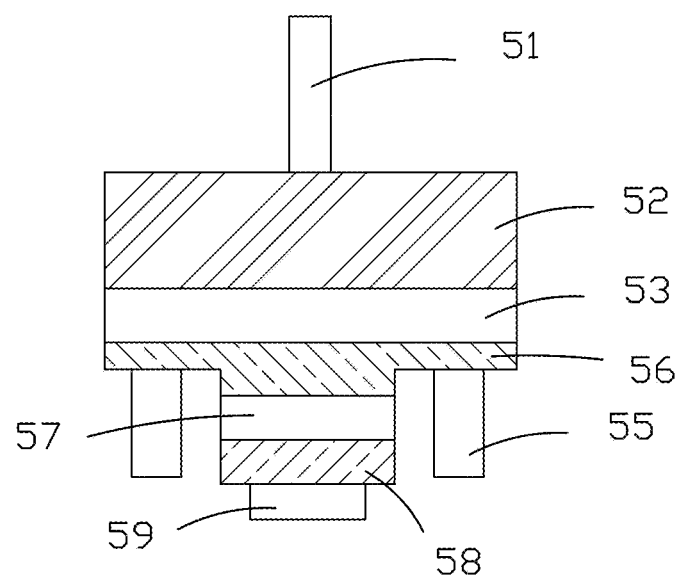
FIG. 4 is a cross-sectional view of the light-emitting diode in FIG. 2 and FIG. 3.

As shown in FIG. 4, the LED 50 further includes a base layer 52, a buffer layer 53, an N-type layer 56, a band gap layer 57, and a P-type layer 58. The navigation post 51 is on a side of the base layer 52 away from the first electrode 55 and the second electrode 59. The base layer 52, the buffer layer 53, the N-type layer 56, the band gap layer 57, the P-type layer 58 are stacked in sequence along a direction from the navigation post 51 toward the second electrode 59. The first electrode 55 is on a side of the N-type layer 56 away from the buffer layer 53. The first electrode 55 is electrically connected to the N-type layer 56, and the second electrode 59 is electrically connected to the P-type layer 58. The N-type layer 56, the band gap layer 57 and the P-type layer 58 constitute a PN junction. When there is a forward bias between the N-type layer 56 and the P-type layer 58 of the LED 50, the LED 50 emits light.

The navigation post 51 is configured for navigation and orientation during a fluid self-assembly process of the LEDs 50. The navigation post 51 may be located at the geometric center of the substrate 52. The navigation post 51 may be cylindrical, conical, or other shapes with the post height and diameter chosen to facilitate bottom side up orientation of the LEDs 50 during the fluid self-assembly process.

In one embodiment, the insulating layer 70 is an organic material or an inorganic material that can be exposed and etched.

Figure 5:
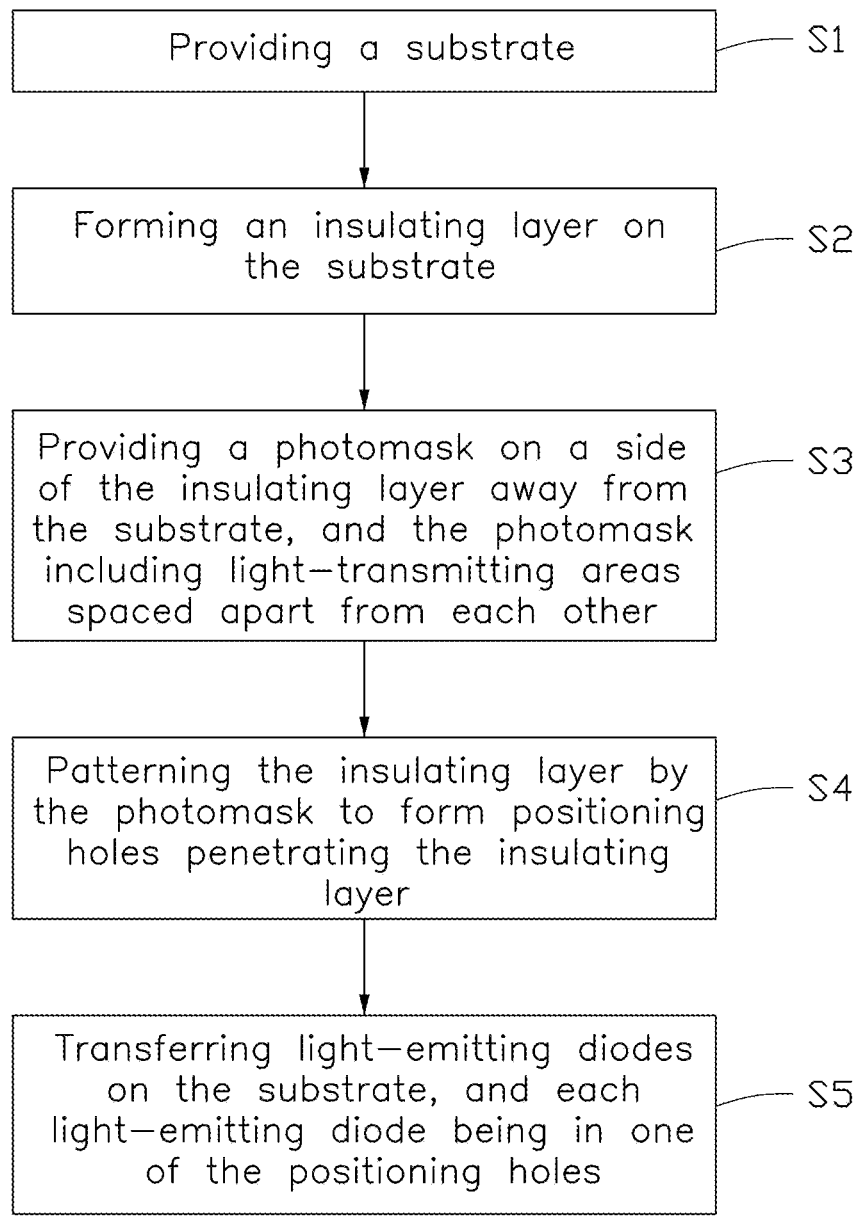
FIG. 5 is a flowchart of a method of fabricating the light-emitting array substrate according to an embodiment of the present disclosure.

Referring to FIG. 5, a flow chart of a method of fabricating a light-emitting array substrate is disclosed. The method is provided by way of embodiment, as there are a variety of ways to carry out the method. The method described below can be carried out using the configurations illustrated in FIGS. 6 through 9, for example, and various elements of these figures are referenced in explaining the method. Each block shown in FIG. 5 represents one or more processes, methods, or subroutines, carried out in the method. Additionally, the illustrated order of blocks is by example only and the order of the blocks can change. The method can begin at Block S1.

In Block S1, a substrate is provided.

In one embodiment, in Block S1, a plurality of separate conductive structures 30 is formed on the substrate 10. The substrate 10 includes driving circuit (e.g., thin film transistors) electrically connected to the conductive structures 30.

In Block S2, an insulating layer is formed on the substrate. The insulating layer includes a first surface and a second surface opposed to the first surface; the first surface abuts the substrate.

In one embodiment, the insulating layer may be formed by curing or deposition, and the insulating layer covers the substrate 10 and the conductive structures 30.

In Block S3, a photomask is provided on a side of the insulating layer away from the substrate, and the photomask includes a plurality of separate light-transmitting areas.

Figure 6:
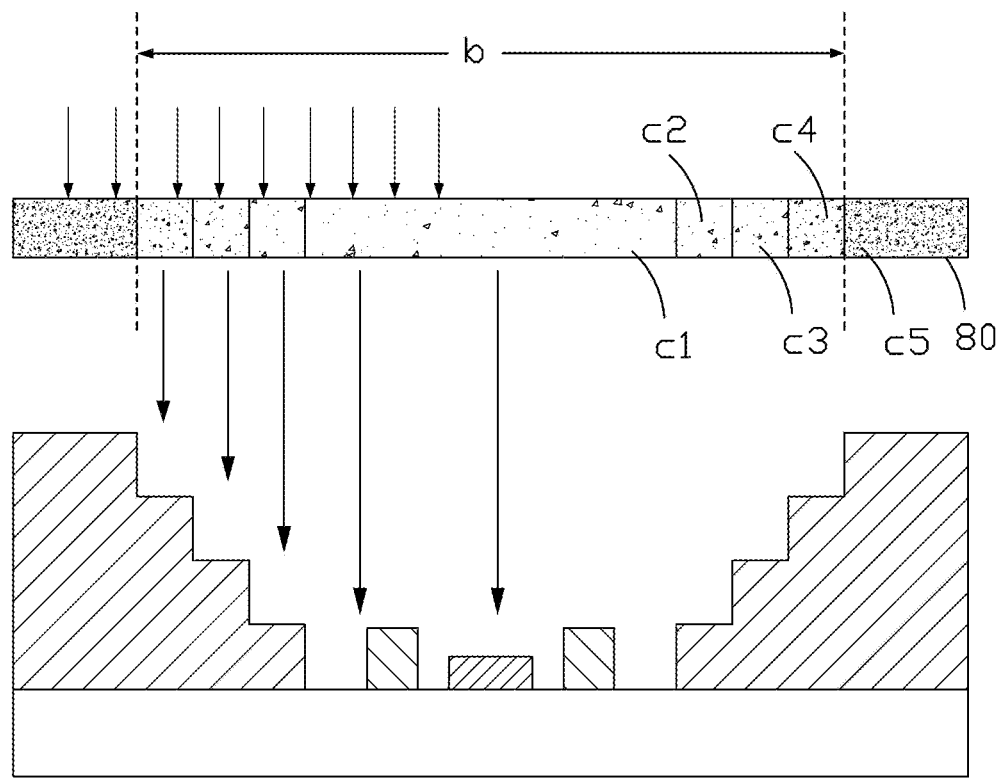
FIG. 6 is a schematic view of Block S4 in the method of FIG. 5.
Figure 7:
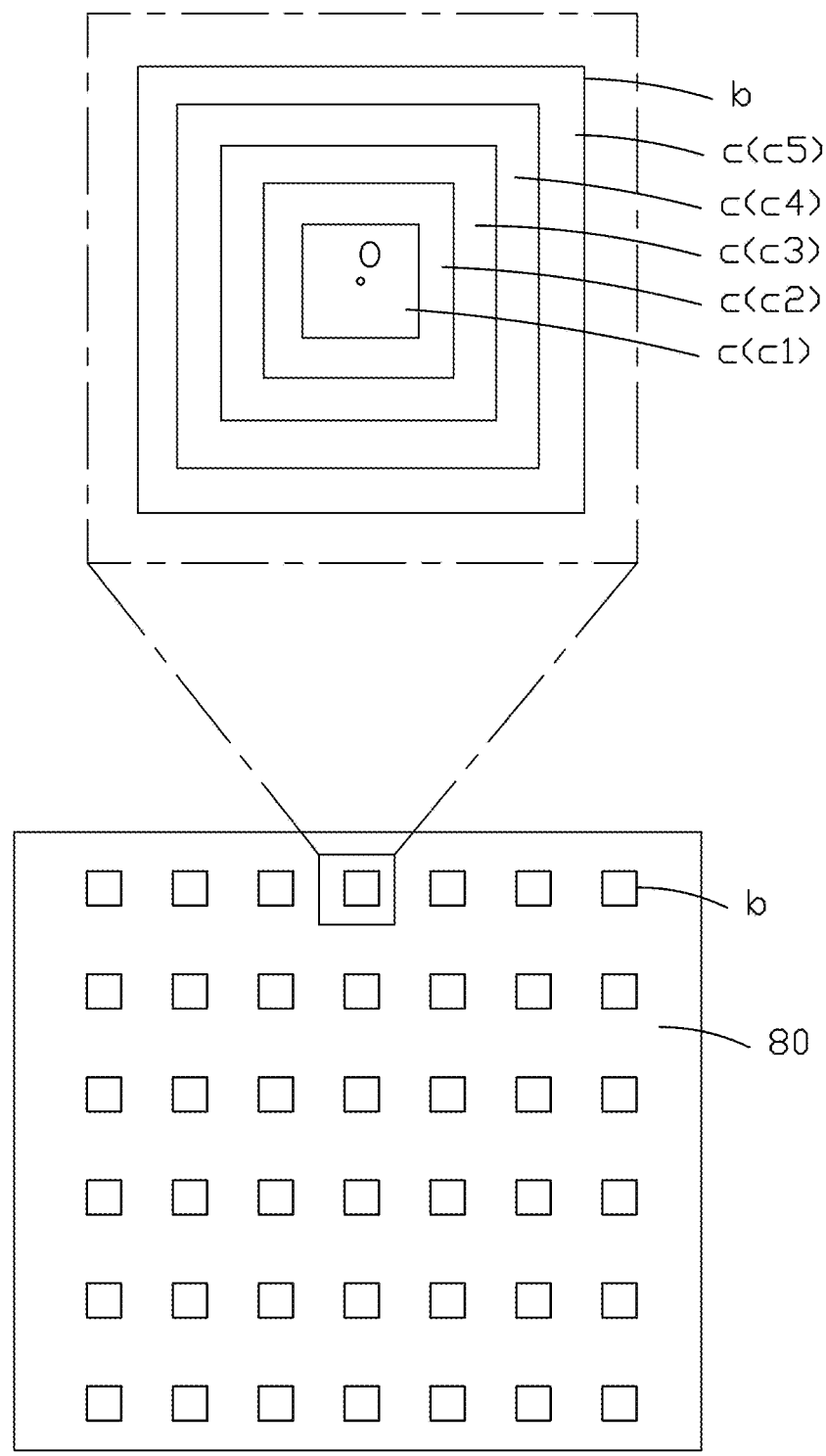
FIG. 7 is a top view of the photomask utilized in the method step shown in FIG. 6.

In one embodiment, as shown in FIGS. 6 and 7, the photomask 80 includes a plurality of separate light-transmitting areas b. Each light-transmitting area b includes a plurality of sub-light-transmitting areas c (i.e., c1, c2, c3, c4, and c5). Each light-transmitting area b is rectangular and has a center O. The sub-light-transmitting areas c1, c2, c3, c4, and c5 are sequentially distributed in a direction away from the center O of the light-transmitting area b. The light-transmitting abilities of the sub-light-transmitting areas c1, c2, c3, c4, and c5 are 100%, 75%, 50%, 25%, and 0%, respectively. That is, the light transmittances of the sub-light-transmitting areas c1, c2, c3, c4, and c5 are gradually decreased along the direction away from the center O. The area of the photomask 80 excluding the transparent area b is completely opaque, that is, having a light-transmitting ability of 0%.

In other embodiments, the light-transmitting area b may include at least three sub-light-transmitting areas c with different light transmittances, and the light transmittance of the light-transmitting area b is gradually increased along a direction close to the center O of the light-transmitting area b. The light-transmitting abilities between adjacent sub-light-transmitting areas c may be equal or unequal.

Figure 8A:
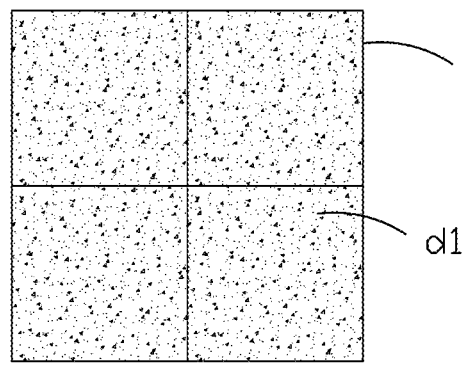
FIGS. 8A through 8E are schematic views showing different light-transmitting sub-areas of the photomask in FIG. 5.
Figure 8B:
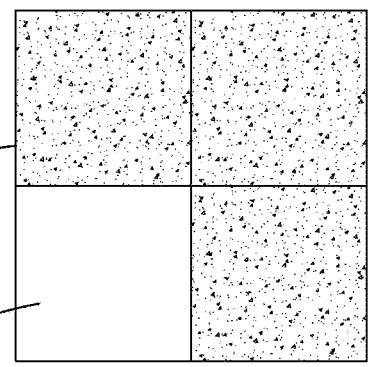
Figure 8C:
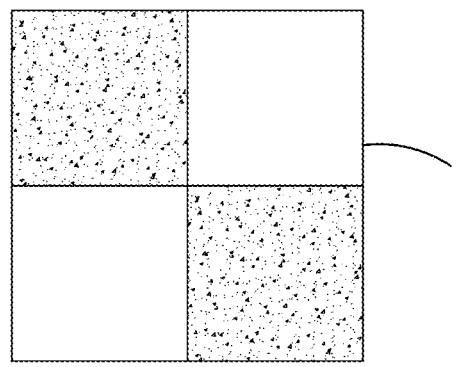
Figure 8D:
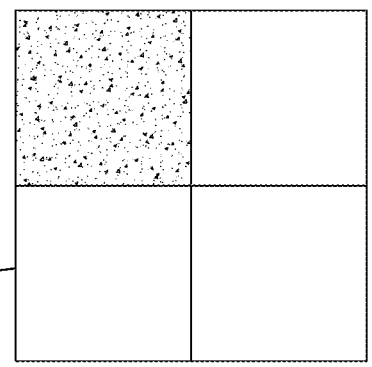
Figure 8E:
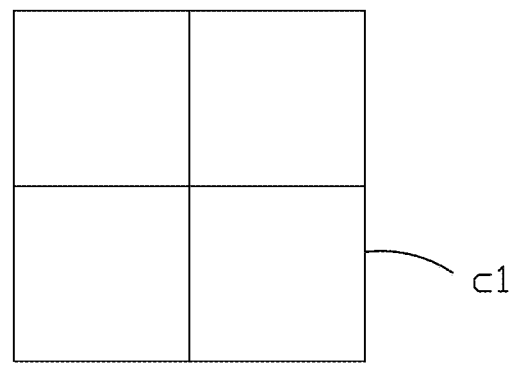

As shown in FIGS. 8A through 8E, each sub-light-transmitting area c includes a light shielding portion d1 with a light transmittance of 0% and a light-transmitting portion d2 with a light transmittance of 100%. The ratio of the light shielding portion d1 and the light-transmitting portion d2 in the sub-light-transmitting areas with different light transmittances are different. The sub-light-transmitting area c5 in FIG. 8A only includes the light-shielding portions d1, so the light transmittance of the sub-light-transmitting area c5 is 0%. In FIG. 8B, the ratio of the light-shielding portions d1 and the light-transmitting portions d2 is 3:1, so that the light transmittance of the sub-light-transmitting area c4 is 25%. In FIG. 8C, the ratio of the light-shielding portions d1 and the light-transmitting portions d2 is 1:1, so that the light transmittance of the sub-light-transmitting area c3 is 50%. In FIG. 8D, the ratio of the light-shielding portions d1 and the light-transmitting portions d2 is 1:3, so that the light transmittance of the sub-light-transmitting area c2 is 75%. The sub-light-transmitting area c1 in FIG. 8E includes only the light-transmitting portions d2, thus the light transmittance of the sub-light-transmitting area c1 is 100%. The surfaces of the light-shielding portions d1 and the light-transmitting portions d2, through which light passes, are both square. The surface areas of the light-shielding portion d1 and the light-transmitting portion d2 are equal, and the side length of the square is 1 μm. In other embodiments, the light-shielding portion d1 and the light-transmitting portion d2 may be rectangular, circular, or other shape. In addition, a ratio of areas of the light shielding portion d1 and the light-transmitting portion d2 in the sub-light-transmitting areas with different light transmittances are different.

In Block S4, the insulating layer is patterned by the photomask to form a plurality of positioning holes penetrating the insulating layer. The insulating layer forms one positioning hole corresponding to one light-transmitting area. Each of the positioning holes penetrates the first surface and the second surface, and each of the positioning holes includes a first opening formed in the first surface and a second opening formed in the second surface. For each of the positioning holes, a size of the first opening is less than a size of the second opening, and along a thickness direction of the substrate, a projection of the second opening on the substrate more than covers a projection of the first opening on the substrate.

As shown in FIG. 6, in Block S4, the insulating layer 70 patterned by the photomask 80, thereby forming one of the positioning holes 40 corresponding to each light-transmitting area b. The positions of the insulating layer 70 corresponding to the sub-light-transmitting areas c of different light-transmitting abilities are etched to different degrees. The insulating layer 70 is completely etched at a position corresponding to the sub-light-transmitting area c1 with the transmittance of 100%, and a first opening 711 is formed on the first surface 71. The insulating layer 70 corresponding to the sub-light-transmitting area c5 with the light transmittance of 0% is not etched. The insulating layer 70 is partially etched at a position corresponding to the sub-light-transmitting area c4 having a transmittance of 25%, and a second opening 731 is formed on the second surface 73. The size of the first opening 711 is less than the size of the second opening 731, and the projection of the second opening 731 on the surface 11 completely covers the projection of the first opening 711 on the surface 11. The insulating layer 70 forms the hole wall 41 of the positioning hole 40 at a position corresponding to the outline of the sub-light-transmitting areas c.

The higher the light transmittance of the sub-light-transmitting area c is, the higher is the degree of etching of the area corresponding to the insulating layer 70. The light transmittance of the sub-light-transmitting areas c of the light-transmitting area b is gradually increased along the direction close to the center O of the light-transmitting area b, and the stepped positioning hole 40 is formed on the insulating layer 70. In other embodiments, the higher the light transmittance of the sub-light-transmitting area c, the less is the degree of etching of the area corresponding to the insulating layer 70. The light transmittance of the sub-light-transmitting areas c of the light-transmitting area b is gradually decreased along the direction close to the center O of the light-transmitting area b, and the stepped positioning hole 40 is formed on the insulating layer 70.

In other embodiments, the transmittance ability of the light-transmitting area b is uniformly increased along a direction close to the center O of the light-transmitting area b. The distance between the hole wall 41 and the LED 10 is uniformly decreased along the direction from the second opening 731 toward the first opening 711.

In other embodiments, the distance between the hole wall 41 and the substrate 10 may be non-uniformly decreased along the direction from the second opening 731 toward the first opening 711. The distance from the hole wall 41 to the substrate 10 can be entirely reduced along the direction from the second opening 731 toward the first opening 711. That is, there is a region where the distance from the hole wall 41 to the substrate 10 gradually increases in the direction from the second opening 731 toward the first opening 711.

In one embodiment, in block S4, the degree of etching applied to the insulating layer 70 may be further controlled by setting the light intensity or the exposure time. By controlling the distance from each sub-light-transmitting area c to the center O of the light-transmitting area b and the etching depth of the insulating layer 70, the included angle between the hole wall 41 and the substrate 10 may be formed in a range from 30 degrees to 60 degrees.

In Block S5, a plurality of light-emitting diodes is transferred on the substrate by a fluid self-assembly process. Each of the light-emitting diodes is in one of the positioning holes and includes an electrode electrically connected to the substrate and a navigation post opposite to the electrode and on a side of the electrode away from the substrate.

Figure 9:
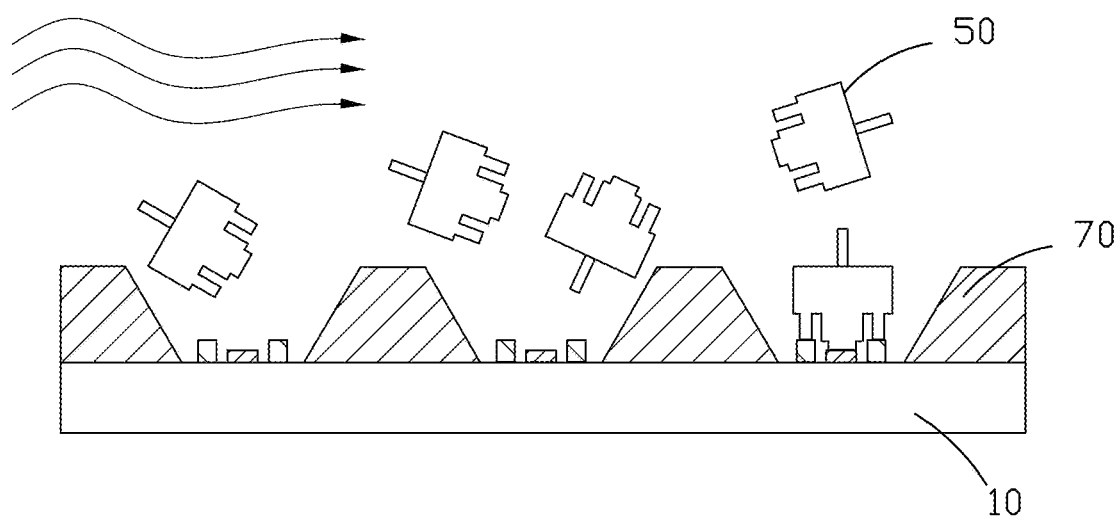
FIG. 9 is a schematic view of Block S5 in the method of FIG. 5.

As shown in FIG. 9, in Block S5, the LED 50 is mixed into a liquid suspension or medium. The flow of the liquid suspension is used to drive the LEDs 50 to fall into the positioning holes 40. Some examples of the liquid suspension include water, alcohols, ketones, alkanes, and organic acids. The liquid is agitated by some means such as a brush or a blade, or a stream of solvent or gas to produce liquid flow across the substrate 10. As the LEDs 50 move over the substrate 10, there are many trapping attempts, to catch and hold the LEDs 50 in the positioning holes 40. If the LED 50 enters a positioning hole 40 with the navigation post 51 down, the navigation post 51 prevents the LED 50 from being captured, and the force of the liquid on the LED 50 tends to tip the LED 50 out of the positioning hole 40 and flip the orientation to electrodes 55 and 59 pointing down. If the LED 50 is captured in positioning hole 40 with the navigation post 51 up, the resultant net force exerted by fluid flow is much less because of the smaller cross-sectional area of the navigation post 51, so the probability of displacing a trapped LED 50 is low.

Since the size of the first opening 711 is less than the size of the second opening 731, and along the thickness direction of the substrate 10, the projection of the second opening 731 on the substrate 10 completely covers the projection of the first opening 711 on the substrate 10, the hole wall 41 of the positioning hole 40 being inclined with respect to the substrate 10. During the fluid self-assembly process, the liquid flows along hole wall 41 inclined with respect to the substrate 10, and the probability of the navigation post 51 of the light emitting diode 50 falling into the positioning hole 40 is reduced accordingly. Even if the navigation post 51 of the LED 50 is trapped against the hole wall 41, the overall inclined hole wall 41 provides enough space for the LED 50 to escape under the action of the fluid. The included angle between the hole wall 41 and the substrate 10 ranges from 30 degrees to 60 degrees, which prevents the navigation post 51 from sinking into the hole wall 41 and being locked or semi-locked in the positioning holes 40. An over-gentle hole wall would prevent the LEDs 50 from being accurately fixed in the positioning holes 40. Therefore, the light emitting array substrate 100 effectively improves the seating and bonding of the light emitting diodes 50.

Figure 10:
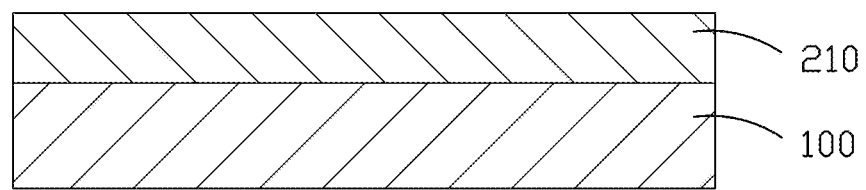
FIG. 10 is a cross-sectional view of a display panel according to an embodiment of the present disclosure.

As shown in FIG. 10, a display panel 200 using the light-emitting array substrate 100 is provided. The display panel 200 further includes an optical function layer 210 on the light-emitting array substrate 100.

In one embodiment, the light-emitting array substrate 100 is a backlight module of the display panel 200 for emitting a white light. The optical function layer 210 is selected from the group consisting of an encapsulation layer, a liquid crystal cell, a polarizer, a brightness enhancement film, and a cover plate. The liquid crystal cell may include a color filter substrate, a thin film transistor array substrate opposite to the color filter substrate and liquid crystal layer between the color filter substrate and the thin film transistor array substrate. The optical function layer 210 may further include two polarizers on opposite sides of the liquid crystal cell. The polarizers are used for dimming the white light, so that the display panel 200 emits image light of different colors and different brightness. The encapsulation layer and the cover plate protect the light-emitting array substrate 100, and the brightness enhancement film is used to improve the display effect of the display panel 200.

In one embodiment, the light-emitting array substrate 100 is a self-illuminating display substrate, and the LEDs 50 emit lights of different colors and brightness to directly display images. The optical function layer 210 is selected from the group consisting of an encapsulation layer, a polarizer, and a cover plate, so as to protect the light-emitting array substrate 100 or improve the display of the display panel 200. The display panel 200 which includes the light-emitting array substrate 100 achieves all the beneficial effects of the light-emitting array substrate 100.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:
1. A light-emitting array substrate, comprising:
a substrate;
an insulating layer on the substrate, the insulating layer comprising a first surface and a second surface opposed to the first surface, the first surface being closer to the substrate than the second surface, the insulating layer comprising a plurality of positioning holes penetrating the first surface and the second surface, and each of the plurality of positioning holes comprising a first opening formed in the first surface and a second opening formed in the second surface; and
a plurality of light-emitting diodes, each of the plurality of light-emitting diodes being in one of the plurality of positioning holes and comprising an electrode electri- cally connected to the substrate and a navigation post opposite to the electrode and on a side of the electrode away from the substrate;

wherein, for each of the plurality of positioning holes, a size of the first opening is less than a size of the second opening, and along a thickness direction of the substrate, a projection of the second opening on the substrate completely covers a projection of the first opening on the substrate.

2. The light-emitting array substrate of claim 1, wherein each of the plurality of positioning holes comprises a hole wall connecting the first surface and the second surface; and in a cross section of the insulating layer along the thickness direction of the substrate, on a same side of one of the plurality of light-emitting diodes, a line segment is formed by connecting an intersection point between the hole wall and the first surface and an intersection point between the hole wall and the second surface, and an included angle between the line segment and the substrate is in a range of 30 degrees to 60 degrees.

3. The light-emitting array substrate of claim 1, wherein each of the plurality of positioning holes comprises a hole wall connecting the first surface and the second surface, and a distance between the hole wall and the substrate is gradually decreased along a direction of the second opening toward the first opening.

4. The light-emitting array substrate of claim 3, wherein the distance between the hole wall and the substrate is uniformly decreased along the direction from the second opening toward the first opening, or each of the plurality of positioning holes is a stepped hole.

5. The light-emitting array substrate of claim 1, further comprising a plurality of conductive structures insulated and spaced apart from each other on the substrate, wherein at least a part of each of the plurality of conductive structures is exposed to one of the plurality of positioning holes and is electrically connected to the electrode of one of the plurality of light-emitting diodes.

6. The light-emitting array substrate of claim 5, wherein the electrode comprises a first electrode and a second electrode spaced apart from each other, each of the plurality of conductive structures comprises a first conductive portion and a second conductive portion spaced apart from each other, the first conductive portion is electrically connected to the first electrode and configured to apply a first voltage to the first electrode, and the second conductive portion is electrically connected to the second electrode and configured to apply a second voltage different from the first voltage to the second electrode.

7. The light-emitting array substrate of claim 1, wherein each of the plurality of light-emitting diodes is a mini light-emitting diode or a micro light-emitting diode.

8. A method of fabricating a light-emitting array substrate, comprising:

providing a substrate;

forming an insulating layer on the substrate, wherein the insulating layer comprises a first surface and a second surface opposed to the first surface, and the first surface is closer to the substrate than the second surface;

forming a plurality of positioning holes on the insulating layer, wherein each of the plurality of positioning holes penetrates the first surface and the second surface, and each of the plurality of positioning holes comprises a first opening formed in the first surface and a second opening formed in the second surface, and for each of the plurality of positioning holes, a size of the first opening is less than a size of the second opening, and along a thickness direction of the substrate, a projection of the second opening on the substrate completely covers a projection of the first opening on the substrate; and transferring a plurality of light-emitting diodes on the substrate by a Fluid self-assembly process, wherein each of the plurality of light-emitting diodes is in one of the plurality of positioning holes and comprises an electrode electrically connected to the substrate and a navigation post opposite to the electrode and on a side of the electrode away from the substrate.

9. The method of fabricating the light-emitting array substrate of claim 8, wherein forming the plurality of positioning holes comprises:

providing a photomask on a side of the insulating layer away from the substrate, the photomask comprising a plurality of light-transmitting areas spaced apart from each other; and patterning the insulating layer by the photomask, wherein the insulating layer forms one of the plurality of positioning holes corresponding to each of the plurality of light-transmitting areas.

10. The method of fabricating the light-emitting array substrate of claim 9, wherein each of the plurality of light-transmitting areas has a center and comprises a plurality of sub-light-transmitting areas which is sequentially distributed along a direction away from the center; and the light transmittances of the plurality of sub-light-transmitting areas are gradually increased or gradually decreased along the direction away from the center.

11. The method of fabricating the light-emitting array substrate of claim 10, wherein each of the plurality of sub-light-transmitting areas comprises a light shielding portion with a light transmittance of 0% and a light transmitting portion with a light transmittance of 100%, and a ratio of the light shielding portion and the light transmitting portion in the plurality of sub-light-transmitting areas with different light transmittances are different.

12. The method of fabricating the light-emitting array substrate of claim 9, wherein each of the plurality of light-transmitting areas has a center, and the light transmittance of each of the plurality of light-transmitting areas is gradually increased or gradually decreased along the direction away from the center.

13. A display panel, comprising:

a light-emitting array substrate, and an optical function layer on the light-emitting array substrate;

wherein the light-emitting array substrate comprises:

a substrate;

an insulating layer on the substrate, the insulating layer comprising a first surface and a second surface opposed to the first surface, the first surface being closer to the substrate than the second surface, the insulating layer comprising a plurality of positioning holes penetrating the first surface and the second surface, and each of the plurality of positioning holes comprising a first opening formed in the first surface and a second opening formed in the second surface; and a plurality of light-emitting diodes, each of the plurality of light-emitting diodes being in one of the plurality of positioning holes and comprising an electrode electrically connected to the substrate and a navigation post opposite to the electrode and on a side of the electrode away from the substrate;

wherein, for each of the plurality of positioning holes, a size of the first opening is less than a size of the second opening, and along a thickness direction of the substrate, a projection of the second opening on the substrate completely covers a projection of the first opening on the substrate.

14. The display panel of claim 13, wherein the light-emitting array substrate is a backlight module of the display panel for emitting a white light, and the optical function layer is selected from the group consisting of an encapsulation layer, a liquid crystal cell, a polarizer, a brightness enhancement film, and a cover plate.

15. The display panel of claim 13, wherein the light-emitting array substrate is a self-illuminating display substrate, and the optical function layer is selected from the group consisting of an encapsulation layer, a polarizer, and a cover plate.

16. The display panel of claim 13, wherein each of the plurality of positioning holes comprises a hole wall connecting the first surface and the second surface; and in a cross section of the insulating layer along the thickness direction of the substrate, on a same side of one of the plurality of light-emitting diodes, a line segment is formed by connecting an intersection point between the hole wall and the first surface and an intersection point between the hole wall and the second surface, and an included angle between the line segment and the substrate is in a range of 30 degrees to 60 degrees.

17. The display panel of claim 13, wherein each of the plurality of positioning holes comprises a hole wall connecting the first surface and the second surface, and a distance between the hole wall and the substrate is gradually decreased along a direction of the second opening toward the first opening.

18. The display panel of claim 17, wherein the distance between the hole wall and the substrate is uniformly decreased along the direction from the second opening toward the first opening, or each of the plurality of positioning holes is a stepped hole.

19. The display panel of claim 13, wherein the light-emitting array substrate further comprises a plurality of conductive structures insulated and spaced apart from each other on the substrate, and at least a part of each of the plurality of conductive structures is exposed to one of the plurality of positioning holes and is electrically connected to the electrode of one of the plurality of light-emitting diodes.

20. The display panel of claim 19, wherein the electrode comprises a first electrode and a second electrode spaced apart from each other, each of the plurality of conductive structures comprises a first conductive portion and a second conductive portion spaced apart from each other, the first conductive portion is electrically connected to the first electrode and configured to apply a first voltage to the first electrode, and the second conductive portion is electrically connected to the second electrode and configured to apply a second voltage different from the first voltage to the second electrode.

* * * * *